US008875895B2

(12) United States Patent
Sasamura et al.

(10) Patent No.: US 8,875,895 B2
(45) Date of Patent: Nov. 4, 2014

(54) STORAGE BODY AND REEL

(71) Applicant: Fujitsu Limited, Kawasaki (JP)

(72) Inventors: Keiichi Sasamura, Kuwana (JP); Koichi Murata, Yokohama (JP); Masahiko Ishiguri, Yokkaichi (JP); Naoyuki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 84 days.

(21) Appl. No.: 13/738,465

(22) Filed: Jan. 10, 2013

(65) Prior Publication Data
US 2013/0193016 A1 Aug. 1, 2013

(30) Foreign Application Priority Data

Jan. 31, 2012 (JP) ................. 2012-019249

(51) Int. Cl.
*B65D 85/00* (2006.01)
*B65D 73/02* (2006.01)
*H05K 13/00* (2006.01)
(52) U.S. Cl.
CPC ............... *B65D 85/00* (2013.01); *B65D 73/02* (2013.01); *H05K 13/0084* (2013.01)
USPC .......................................... 206/714; 206/713
(58) Field of Classification Search
CPC ........................... H05K 13/0084; B65D 73/02
USPC ................... 206/713, 714, 722, 725
See application file for complete search history.

(56) References Cited

U.S. PATENT DOCUMENTS

| | | | | |
|---|---|---|---|---|
| 4,736,841 A | * | 4/1988 | Kaneko et al. | ............... 206/714 |
| 6,003,676 A | * | 12/1999 | Beyer | .......................... 206/714 |
| 6,102,210 A | | 8/2000 | Mikami | |
| 6,425,484 B1 | | 7/2002 | Sakurai | |
| 6,945,406 B2 | * | 9/2005 | Song et al. | .................... 206/714 |
| 7,584,853 B2 | * | 9/2009 | Yoshii et al. | ................... 206/714 |
| 2008/0202981 A1 | | 8/2008 | Hamanaka et al. | |
| 2008/0296201 A1 | | 12/2008 | Lalouch et al. | |
| 2011/0147262 A1 | | 6/2011 | Kudose | |

FOREIGN PATENT DOCUMENTS

| | | |
|---|---|---|
| CN | 1215690 A | 5/1999 |
| CN | 101249904 A | 8/2008 |
| CN | 102137798 A | 7/2011 |
| JP | 2008-28367 A | 2/2008 |
| JP | 2009-102025 A | 5/2009 |
| JP | 2010-163188 A | 7/2010 |

OTHER PUBLICATIONS

Chinese Office Action dated Jul. 1, 2014, issued in Chinese Patent Application No. 201310039022.4 with English translation (9 pages).

* cited by examiner

*Primary Examiner* — David Fidei
(74) *Attorney, Agent, or Firm* — Westerman, Hattori, Daniels & Adrian, LLP

(57) ABSTRACT

The storage body includes a tape formed with recess portions that dip in in a thickness direction formed at intervals along the tape length direction and a cover that is superimposed on the tape and closes off openings of the recess portions. The tape is fixed to the tape by intermediate fixing portions and a pair of side fixing portions. The intermediate fixing portions are formed between the mutually adjacent recess portions. The pair of side fixing portions include overlapping portions and connect portions. The overlapping portions are formed at the two tape width direction sides of the intermediate fixing portions so as to overlap with the intermediate fixing portions along the tape length direction. The connect portions are formed with constant width connecting together the respective overlapping portions disposed in lines along the tape length direction.

6 Claims, 12 Drawing Sheets

STORAGE BODY AND REEL

CROSS-REFERENCE TO RELATED APPLICATION

This application is based upon and claims the benefit of priority of the prior Japanese Patent Application No. 2012-019249, filed on Jan. 31, 2012, the entire contents of which are incorporated herein by reference.

FIELD

The embodiments discussed herein are related to a storage body and a reel.

BACKGROUND

Small electronic components such as electrical connectors and semiconductor devices are stored in a tape formed with recess portions at intervals along the length direction. The openings of the recess portions are then closed off with a cover. A storage body configured by the tape and cover is then wound on a reel for shipping.

Such tapes and covers are conventionally fixed with fixing portions as described below.

For example, known fixing portion configurations include rectangular shaped intermediate fixing portions formed between mutually adjacent recess portions, and a pair of side fixing portions continuously formed with a constant width along the tape length direction at the two tape width direction sides of the intermediate fixing portions.

Other known fixing portion configurations include rectangular shaped intermediate fixing portions formed between mutually adjacent recess portions, and pairs of rectangular shaped side fixing portions formed at the two tape width direction sides of the recess portions, with the intermediate fixing portions and the side fixing portions disposed along the tape length direction in a staggered formation.

RELATED PATENT DOCUMENTS

Japanese Laid-open patent publication No. 2009-102025
Japanese Laid-open patent publication No. 2010-163188

SUMMARY

According to an aspect of the embodiments, the storage body disclosed herein includes a tape formed with recess portions that dip in in a tape thickness direction formed at intervals along the tape length direction and a cover that is superimposed on the tape and closes off openings of the recess portions. The tape and cover are fixed together by intermediate fixing portions and a pair of side fixing portions. The intermediate fixing portions are formed between the mutually adjacent recess portions. The intermediate fixing portions have a tape width direction width that increases on progression from one of the mutually adjacent recess portions towards an intermediate portion between the mutually adjacent recess portions, and that decreases on progression from the intermediate portion towards the other mutually adjacent recess portion. The pair of side fixing portions include overlapping portions and connect portions. The overlapping portions are formed at the two tape width direction sides of the intermediate portions, overlapping with the intermediate portions along the tape length direction. The overlapping portions have tape width direction widths that decrease on progression from one of the mutually adjacent recess portions towards an intermediate portion between the mutually adjacent recess portions and that increase on progression from the intermediate portion towards the other mutually adjacent recess portion. The connect portions are formed with constant tape width direction widths connecting together the overlapping portions disposed in lines along the tape length direction. The total width of the intermediate portions and the pair of overlapping portions is equivalent to the total width of the pair of connect portions.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding a storage body and reel of embodiments disclosed herein, with reference to the drawings.

First Exemplary Embodiment

Figure 1:
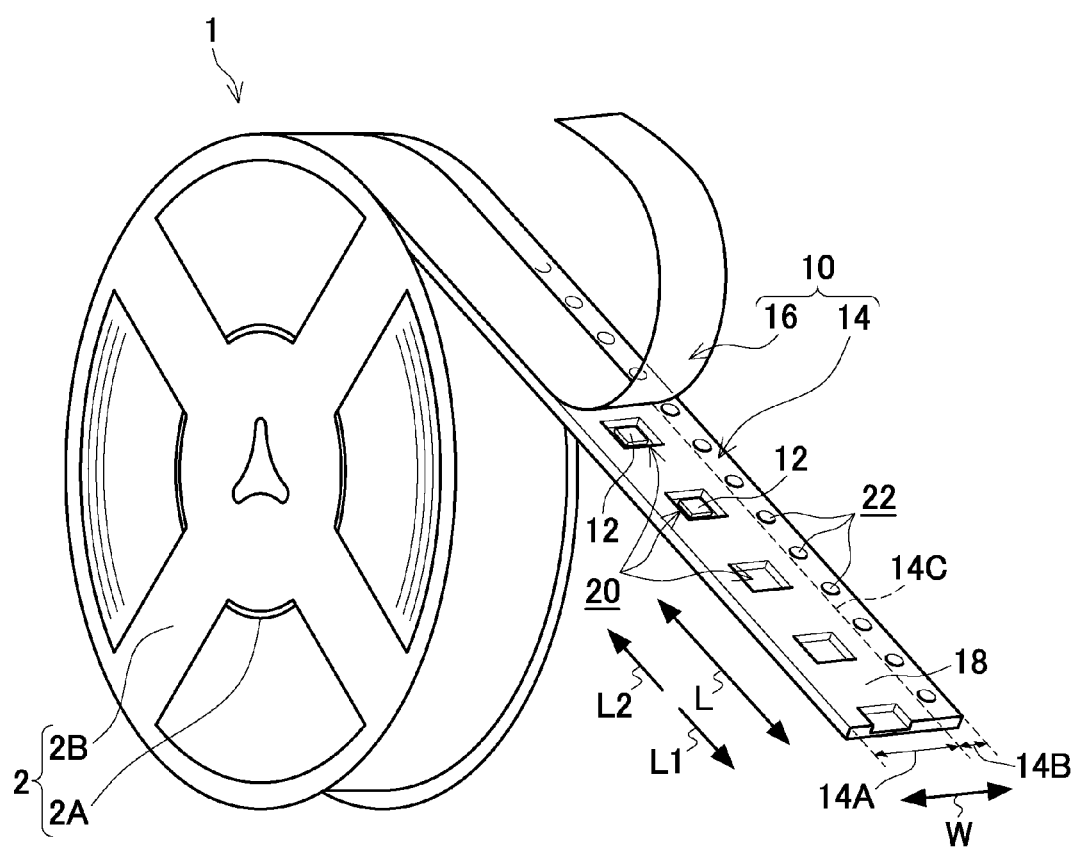
FIG. 1 is a drawing illustrating a storage body according to a first exemplary embodiment, in a state wound onto a reel.

As illustrated in FIG. 1, a reel 1 according to a first exemplary embodiment includes a reel body 2 with flanges 2B attached to the two ends of a circular column shaped center 2A and a storage body 10 wound on the center 2A.

The storage body 10, for example, stores plural electronic components 12 such as electronic connectors or semiconductor devices. The storage body 10 includes a long strip shaped carrier tape 14 and long strip shaped cover tape 16 superimposed on the carrier tape 14.

The carrier tape 14 is formed with a main material of a resin, such as biodegradable plastic, polyvinyl chloride or polyethylene, also containing a material such as carbon powder for antistatic purposes. The carrier tape 14 includes a tape body 14A integrally formed at a constant width along the tape length L direction (length direction) and a feed portion 14B.

The tape body 14A is embossed (extrusion processed) such that plural recess portions 20 are formed as indentations (dish shapes) that dip in in the tape thickness direction in a first thickness direction face 18 of the tape body 14A. Each of the recess portions 20 is positioned at a tape width direction W central portion of the tape body 14A and formed at even intervals along the tape length L direction. The electronic components 12 are stored in the respective recess portions 20. The plan view profile of each of the recess portions 20 matches the outline profile of the electronic components 12, and is for example rectangular shaped. The interval between each of the recess portions 20 is, for example, slightly longer than the tape length L direction length of the recess portions 20.

The feed portion 14B extends in the tape width direction W from one side portion 14C of the tape body 14A. The feed portion 14B is formed spanning along the tape length L direction. Conveying feed holes 22 are formed piercing through the feed portion 14B in the thickness direction at even intervals along the tape length L direction.

The cover tape 16 is superimposed over the entire thickness direction first face 18 of the tape body 14A so as to close off the openings in each of the recess portions 20. The tape body 14A and the cover tape 16 are fixed together through fixing portions 24, described later (see FIG. 2). The cover tape 16 is formed along the tape length L direction at a constant width, with this width being equivalent to the tape body 14A width. The cover tape 16 is formed, for example, with a double-layer structure of polyethylene terephthalate (PET) resin and a polyethylene resin, or a double-layer structure of an olefin resin and polyethylene resin.

Figure 2:
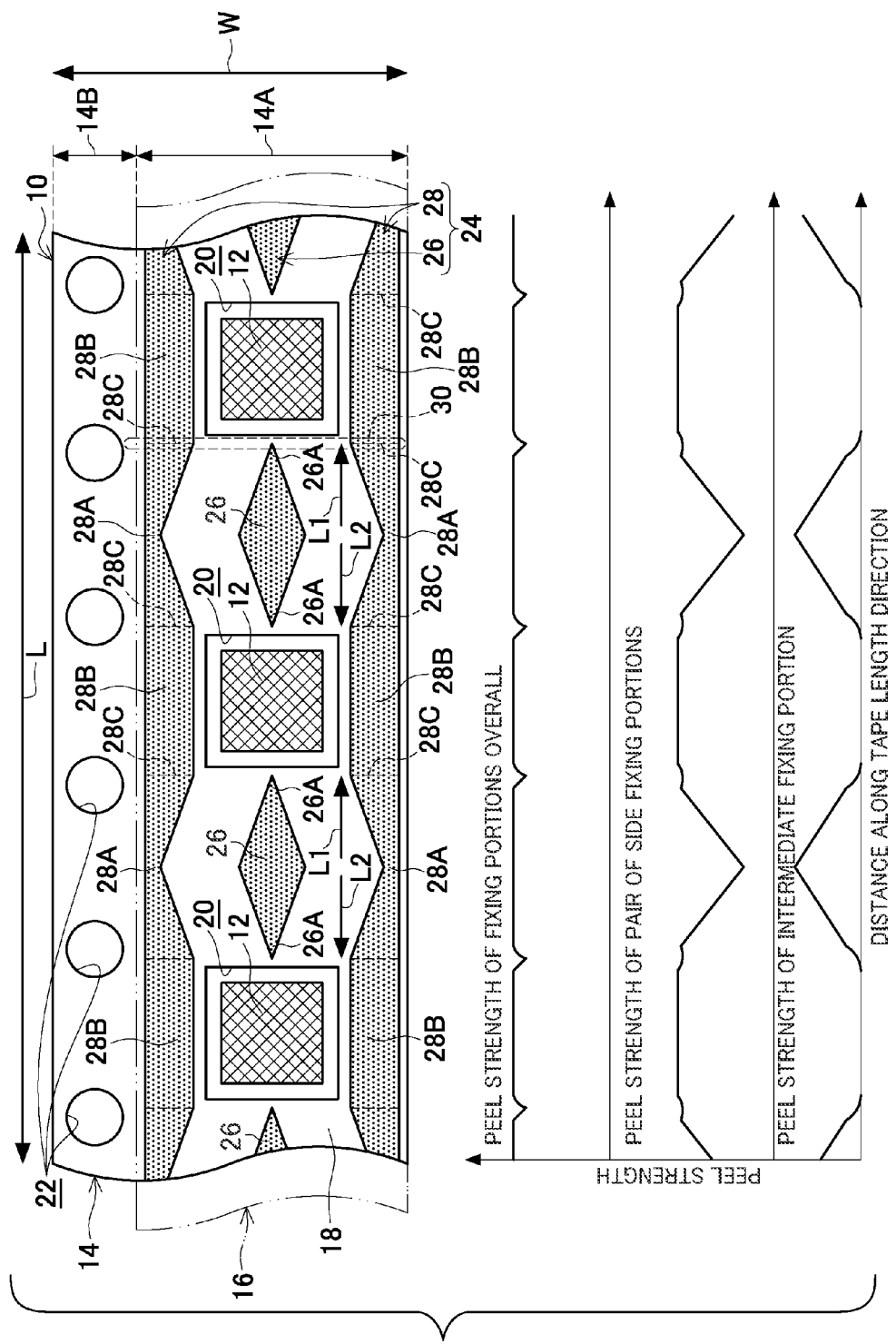
FIG. 2 depicts a plan view of the storage body illustrated in FIG. 1 and a graph illustrating overall peel strength arising from fixing portions in the storage body illustrated in FIG. 1, together with peel strength arising from intermediate fixing portions and peel strength arising from a pair of side fixing portions.

As illustrated in FIG. 2, the fixing portions 24 for fixing together the tape body 14A and the cover tape 16 include intermediate fixing portions 26 and a pair of side fixing portions 28. Note that although the tape body 14A and the cover tape 16 are superimposed on each other over the entire tape width direction W, elements of the tape body 14A such as the recess portions 20 are illustrated with solid lines in FIG. 2 and the cover tape 16 is illustrated with double-dot intermittent lines for clarity.

Figure 3:
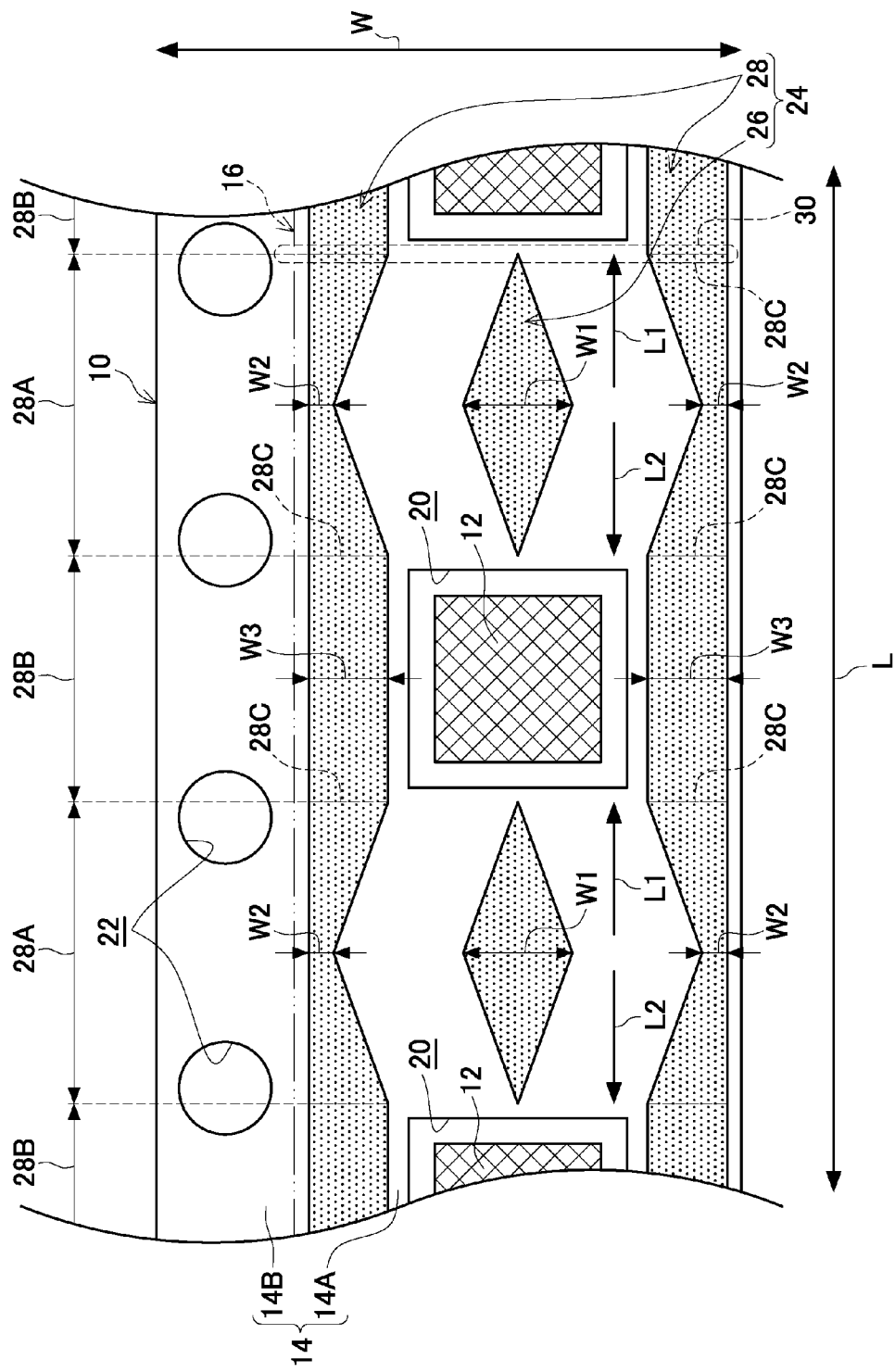
FIG. 3 is an enlarged drawing of the storage body according to the first exemplary embodiment illustrated in FIG. 2.
Figure 4:
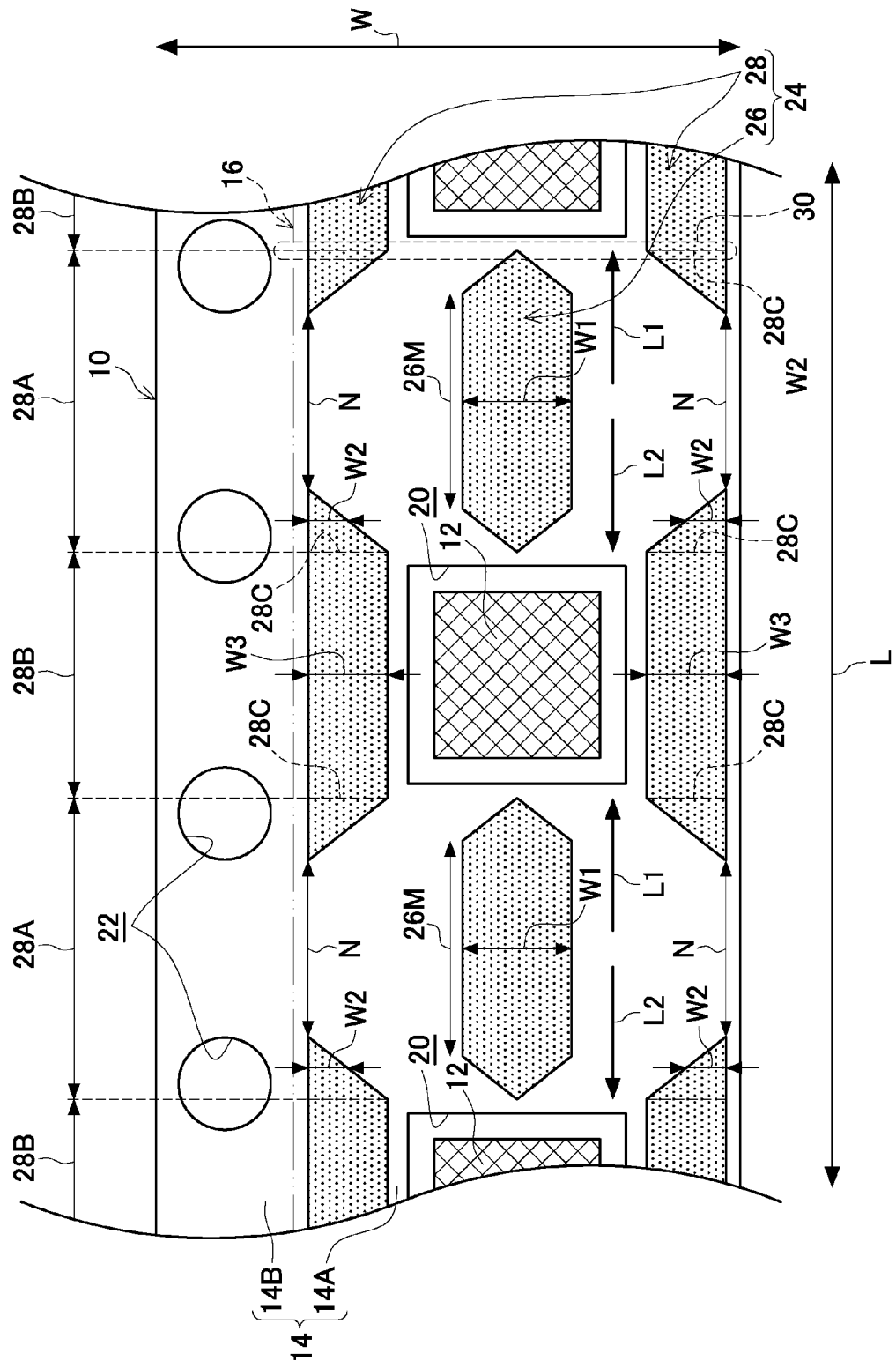
FIG. 4 is a plan view illustrating a modified example of a storage body according to the first exemplary embodiment.

The intermediate fixing portions 26 are formed along the tape length L direction between mutually adjacent recess portions 20. The intermediate fixing portions 26 are positioned at a tape width direction W central portion of the tape body 14A. As illustrated in FIG. 3, the width W1 of the intermediate fixing portions 26 increases on progression from a recess portion 20 on a first direction L1 side of mutually adjacent recess portions 20 towards an intermediate portion (in particular the central portion at the center of the intermediate portion) between mutually adjacent recess portions 20, and decreases on progression from the central portion towards a recess portion 20 on a direction L2 side. In the first exemplary embodiment, a location 26A of the intermediate fixing portions 26 further to the storage portion side than the central portion tapers on progression towards the recess portions 20. Pointed leading end portions are formed at the locations 26A (configuring angled portions) such that the overall plan view profile of the intermediate fixing portions 26 is a diamond shape. The leading end portions of the location 26A are acute angled, and reach as far as the vicinity of the tape width direction W center of the edge portions of the recess portions 20.

The pair of side fixing portions 28 are formed spanning along the tape length L direction at the two tape width direction W sides of the recess portions 20 and the intermediate fixing portions 26. Each of the side fixing portions 28 has an overlapping portion (superimposed portion) 28A and a connect portion 28B.

The overlapping portions 28A are formed at the two tape width direction W sides of the respective intermediate fixing portions 26 and have a width W2 that varies along the tape length L direction, with the side fixing portions 28 overlapping with the intermediate fixing portions 26 along the tape length direction. The connect portions 28B are formed at the two tape width direction W sides of the respective recess portions 20 with a width W3 that is constant along the tape length L direction. The overlapping portions 28A disposed in lines along the tape length L direction are connected together at connect positions 28C. The connect positions 28C are included within boundaries 30 in the tape length L direction where the intermediate fixing portions 26 peter out (portions where the intermediate fixing portions 26 are discontinuous in the fixing portions 24).

The width W2 of the overlapping portions 28A is at a maximum value in the tape length L direction at the connect positions 28C where it is equivalent to the width W3 of the connect portions 28B. The width W2 of the overlapping portions 28A between the connect positions 28C decreases then increases along the tape length L direction to match increases and decreases in the width W1 of the intermediate fixing portions 26.

Specifically, the width W2 of each of the overlapping portions 28A decreases at half the rate of the increase in the width W1 of the intermediate fixing portions 26 on progression from the recess portion 20 on the direction L1 side of mutually adjacent recess portions 20 towards the central portion between mutually adjacent recess portions 20. The width W2 of the overlapping portions 28A is at a minimum value at the intermediate portion between the recess portions 20, and in particular at the central portion between the recess portions 20. The width W2 of each of the overlapping portions 28A increases at half the rate of the decrease in the width W1 of the intermediate fixing portions 26 on progression from the central portion towards the recess portion 20 on the direction L2 side of mutually adjacent recess portions 20 until it reaches its maximum value (W2=W3). As a result, at a given tape length L direction position, the total width Wa of the width W1 of the intermediate fixing portions 26 and the width W2 of the pair of overlapping portions 28A (=W1+W2×2) is equivalent to the total width Wb (=W3×2) of the pair of connect portions 28B.

Explanation follows regarding a method for forming the fixing portions 24 (the intermediate fixing portions 26 and the pair of side fixing portions 28).

The fixing portions 24 are formed, as illustrated in FIG. 5C, by first superimposing the cover tape 16 on the carrier tape 14 in a state in which the electronic components 12 are housed in the recess portions 20 of the tape body 14A. Then a hot-press iron 34 is employed to achieve hot-press fixing.

Figure 5:
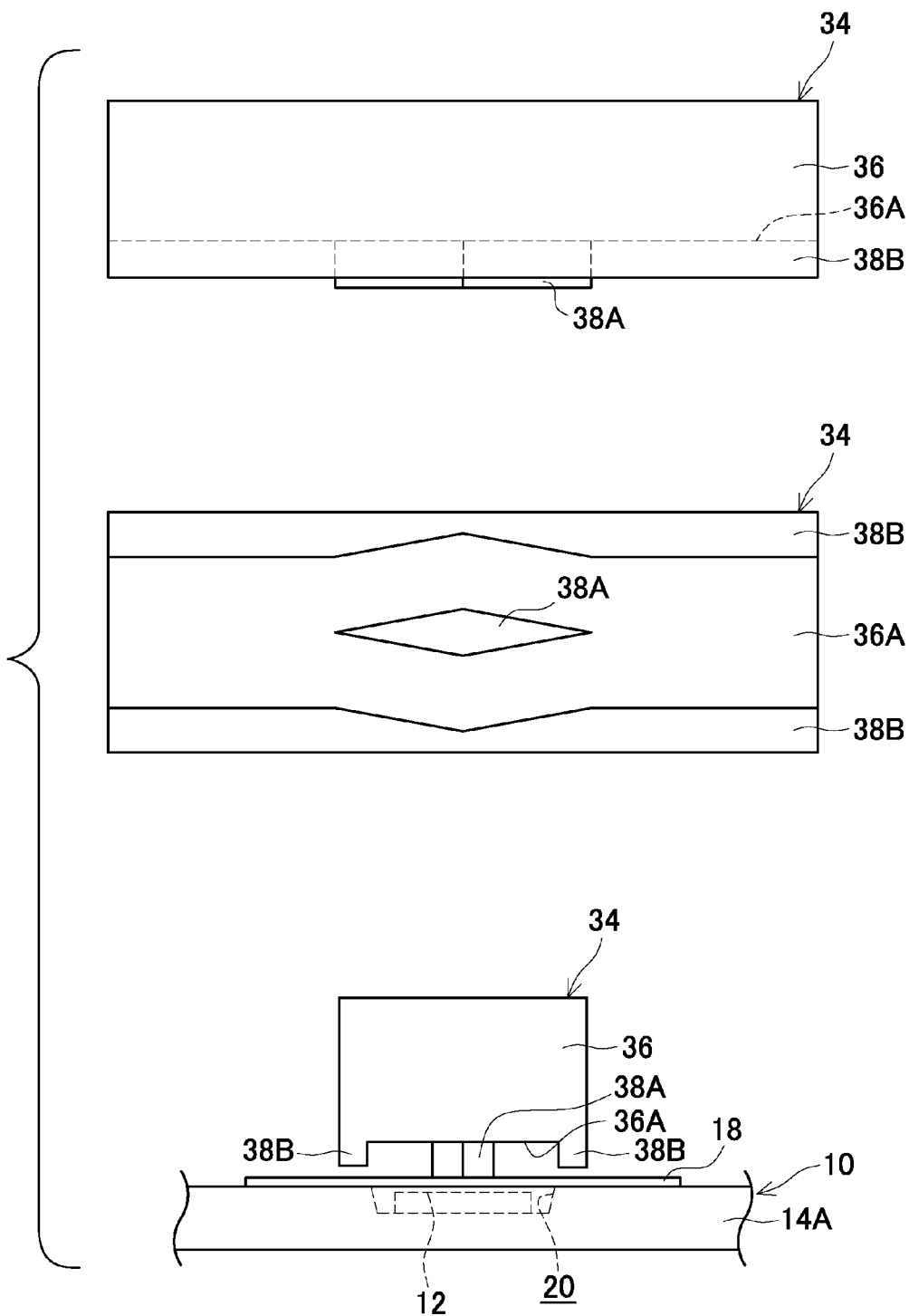
FIG. 5 depicts a face-on view of a hot-press iron, a view of a bottom face of a hot-press iron, and a drawing illustrating hot-press fixing employing a hot-press iron.

The hot-press iron 34, as illustrated in FIG. 5 and FIG. 5, includes a hot-iron body 36, a first projection 38A and second projections 38B. The hot-iron body 36 is formed in a quadrilateral pillar shape that is rectangular in plan view profile. The first projection 38A projects out from a central portion of a height direction face 36A of the hot-iron body 36. The first projection 38A is formed with a plan view profile that is substantially the same as the plan view profile (diamond shape) of the intermediate fixing portions 26. The second projections 38B project out from the two edge portions of the height direction face 36A of the hot-iron body 36. The second projections 38B have plan view profiles that are similar to the plan view profiles of the pair of side fixing portions 28.

The first projection 38A projects out further than the second projections 38B. This approach is adopted such that in cases where there is no support platen provided at the opposite face to the thickness direction first face 18 of the tape body 14A during press fixing with the hot-press iron 34, the first projection 38A projects out further by the amount the locations for forming the intermediate fixing portions 26 move away from the hot-press iron 34. Note that the projection lengths of the first projection 38A and the second projections 38B may be made the same as each other when a platen is provided.

Explanation follows regarding operation and advantageous effects of the reel 1 and the storage body 10 according to the first exemplary embodiment.

The reel 1 according to the first exemplary embodiment is, as illustrated in FIG. 1, mounted in an electronic component feeder inside an electronic component packaging machine, not illustrated in the drawings, with the storage body 10 in a wound state on the center 2A of the reel body 2. Automatic feed pins of the electronic component feeder then engage with the feed holes 22 of the carrier tape 14 and feed out the carrier tape 14 at a constant speed in the first direction L1. The cover tape 16 is peeled by the electronic component feeder off from the carrier tape 14 by continuous tension towards the second direction L2. Then after the cover tape 16 has been peeled off, the electronic components 12 inside each of the recess portions 20 are sucked up by a suction member, not illustrated in the drawings, and taken out for mounting at specific positions on a board, such as an electronic device circuit board.

When the cover tape 16 is peeled off, the magnitude of the peeling force that is the force required to peel off the cover tape 16, namely the peel strength, is in principle proportional to the fixing surface area of the fixing portions 24 between the carrier tape 14 and the cover tape 16.

Explanation follows regarding a storage body of a comparative example in order to clarify the advantageous operational effect of the first exemplary embodiment when the cover tape 16 is being peeled off. Note that for the storage body in the following, the same reference numerals are appended to electronic components, carrier tape, cover tape and recess portions as those of the storage body 10 according to the first exemplary embodiment.

Figure 11:
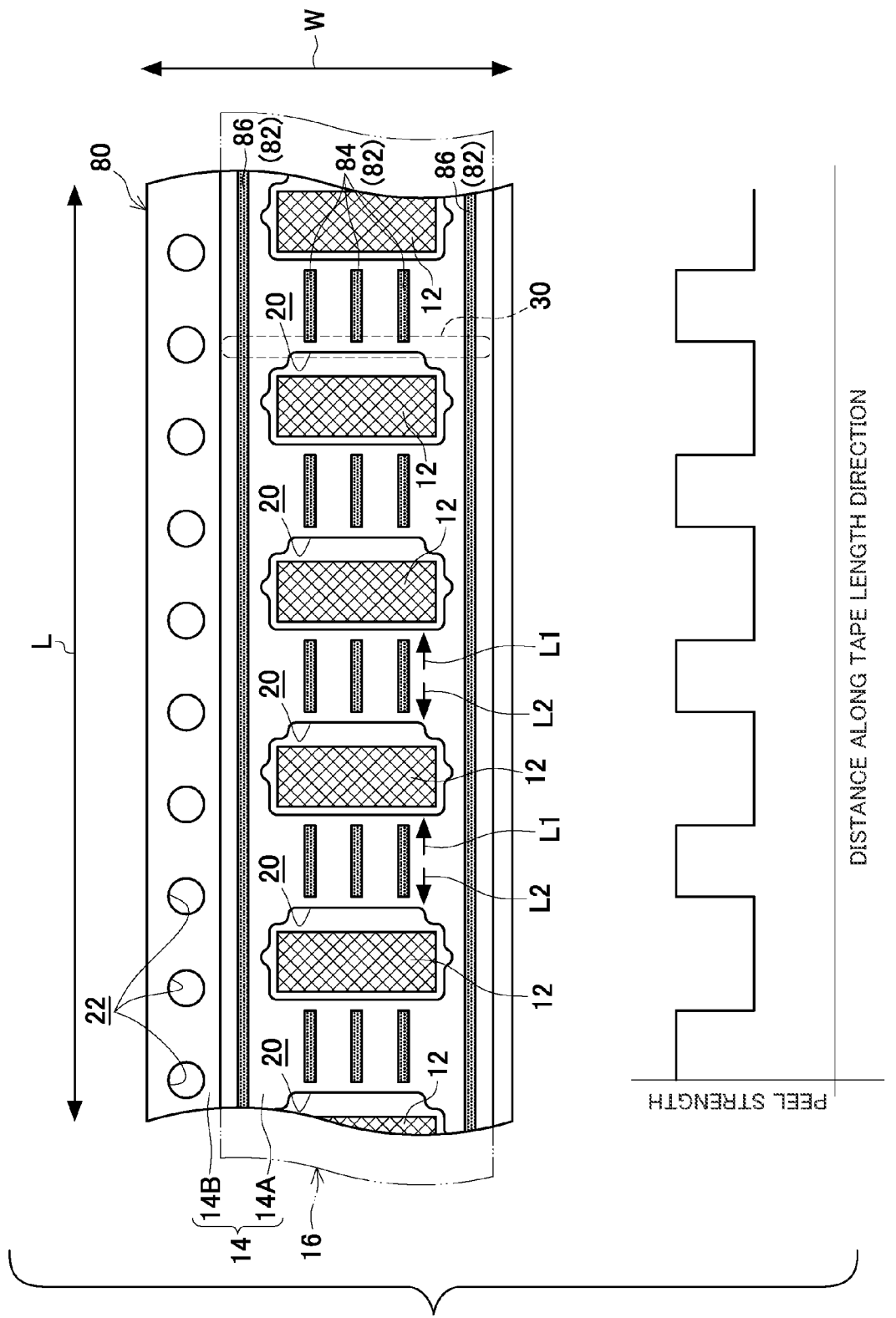
FIG. 11 depicts a plan view of a storage body according to a first comparative example and a graph illustrating peel strength arising from fixing portions in the storage body.

In a storage body 80 of a first comparative example illustrated in FIG. 11, electronic components 12 are housed in recess portions 20 formed in a tape body 14A of a carrier tape 14. The tape body 14A and a cover tape 16 are fixed together by fixing portions 82 so as to close off the openings of the recess portions 20. The fixing portions 82 include intermediate fixing portions 84 formed with rectangular shapes between mutually adjacent recess portions 20, and a pair of side fixing portions 86 formed with a constant width along the tape length L direction at the two tape width direction W sides of the intermediate fixing portions 84.

Figure 12:
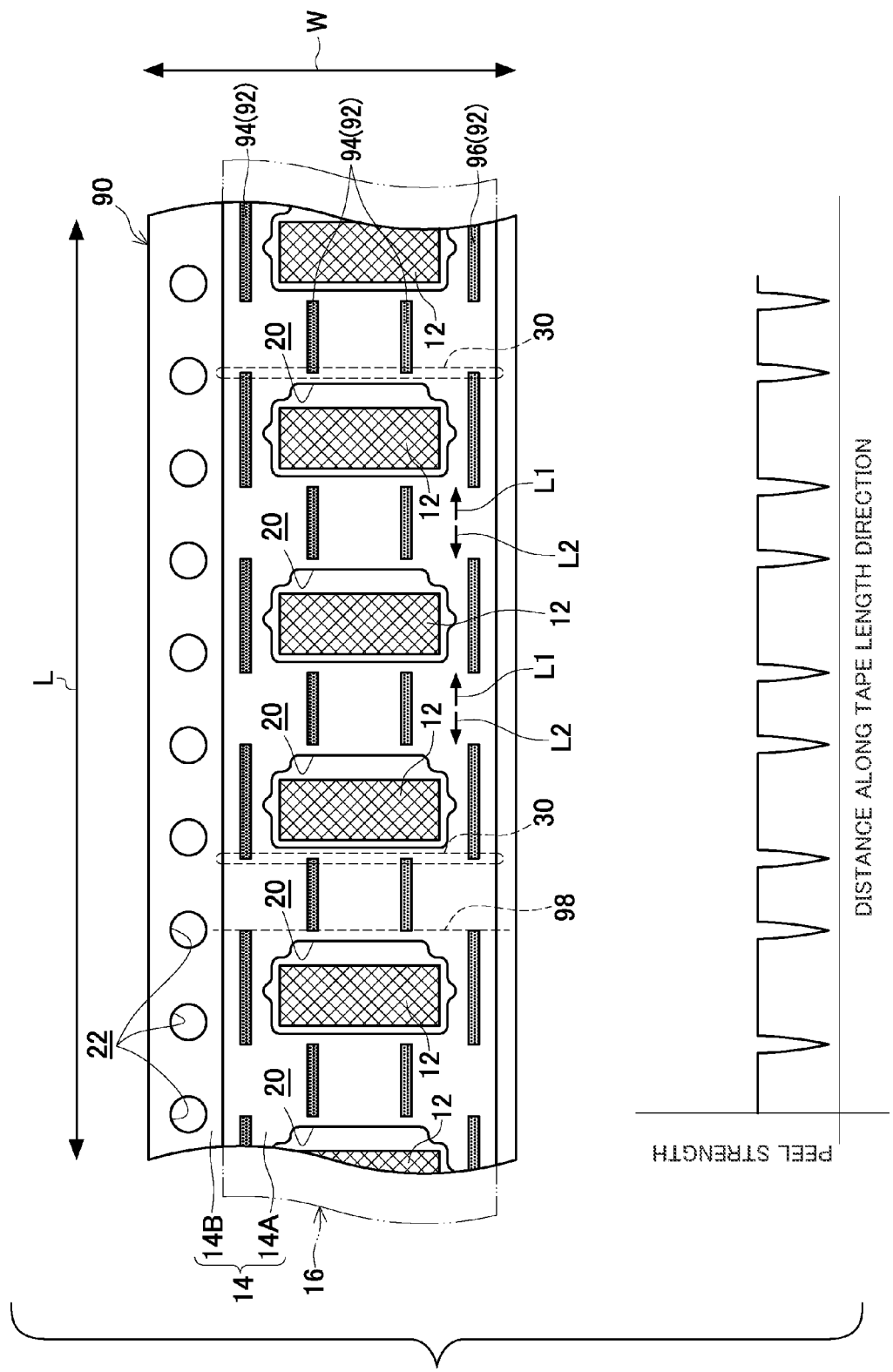
FIG. 12 depicts a plan view of a storage body according to a second comparative example and a diagram illustrating peel strength arising from fixing portions in the storage body.

In a storage body of a second comparative example illustrated in FIG. 12, electronic components 12 are housed in recess portions 20 formed in tape body 14A of a carrier tape 14. The tape body 14A and a cover tape 16 are fixed together by fixing portions 92 so as to close off the openings of the recess portions 20. The fixing portions 92 include intermediate fixing portions 94 formed with rectangular shapes between mutually adjacent recess portions 20, and a pair of side fixing portions 96 formed with rectangular shapes at the two tape width direction W sides of the recess portions 20. The intermediate fixing portions 94 and the pair of side fixing portions 96 are disposed along the tape length L direction in a staggered formation. Discontinuities 98 are present in the tape length L direction between the intermediate fixing portions 94 and the pair of side fixing portions 96, such that the fixing portions 92 are discontinuous between the intermediate fixing portions 94 and the side fixing portions 96.

However, when the side fixing portions 86 are formed, as in the storage body 80 of the first comparative example illustrated in FIG. 11, so as to be continuous with a constant width along the tape length L direction, the overall width of the fixing portions 82 is not constant along the tape length L direction. Namely, the overall width of the fixing portions 82 at the positions where the intermediate fixing portions 84 and the pair of side fixing portions 86 overlap with each other is wider than the overall width of the fixing portions 82 at the other positions along the tape length L direction (the non-overlapping positions). Accordingly, at positions where the intermediate fixing portions 84 and the pair of side fixing portions 86 overlap with each other, the force required to peel off the cover, namely the peel strength, becomes greater at boundaries, the positions of boundaries 30 in the tape length L direction, where the intermediate fixing portions 84 cease to be present. As a result, when the cover tape 16 is peeled off from a first direction L1 towards a second direction L2, the peel strength changes at the boundaries 30, and vibration is generated in the storage body 80 due to the change in the peel strength, with the possibility of the electronic components 12 falling out from the recess portions 20.

In contrast thereto, in the storage body 10 of the first exemplary embodiment, as illustrated in FIG. 2 and FIG. 3, the pair of side fixing portions 28 include the overlapping portions 28A that overlap with the intermediate fixing portions 26, and the connect portions 28B present between the respective overlapping portions 28A. The total width Wa of the intermediate fixing portions 26 and the pair of overlapping portions 28A at a given tape length L direction position is equivalent to the total width Wb of the pair of connect portions 28B. Therefore, in the storage body 10 the overall width of the fixing portions 24 at positions where the intermediate fixing portions 26 and the side fixing portions 28 overlap with each other (=Wa) is not wider than the overall width of the fixing portions 24 at other tape length L direction positions (=Wb). Namely, the overall width of the fixing portions 24 is constant (Wa=Wb=a constant) for all tape length L direction positions. As a result any change in the peel strength of the cover tape 16 at the boundaries 30 where the intermediate fixing portions 26 cease to be present is smaller than in the storage body 80 of the first comparative example (see FIG. 2 and FIG. 11).

However, in the storage body 90 of the second comparative example illustrated in FIG. 12, the overall width of the fixing portions 92 is constant at any tape length L direction position. However, even though the overall width of the fixing portions 92 is constant, a change in the peel strength is experienced due to disposing the intermediate fixing portions 94 along the tape length L direction in a staggered formation. Specifically, since peel strength is in principle proportional to the fixing surface area, making the overall width of the fixing portions 92, in other words the fixing surface area, constant should result in constant peel strength. However, in practice a change in peel strength is observed at the discontinuities 98 of the fixing portions 92. The peel strength of the cover tape 16 at the discontinuities 98 is normally smaller than at other tape length L direction positions, as illustrated in FIG. 12 (however it is sometimes larger). As a result, when the cover tape 16 is peeled off from the first direction L1 towards the second direction L2, the peel strength at the discontinuities 98 varies, vibration is generated in the storage body 90 due to such variation in peel strength, with the possibility of the electronic components 12 falling out from the recess portions 20.

In contrast thereto, with the storage body 10 of the first exemplary embodiment, as illustrated in FIG. 2 and FIG. 3, the carrier tape 14 and the cover tape 16 are not only fixed by the intermediate fixing portions 26, but they are also fixed by the pair of side fixing portions 28 formed along the tape length L direction. Namely, the pair of side fixing portions 28 are configured with the connect portions 28B connecting together the overlapping portions 28A disposed in lines along the tape length L direction. There are accordingly no discontinuities present where the fixing portions 24 (the intermediate fixing portions 26 and the pair of side fixing portions 28) are discontinuous in the tape length L direction. As a result, the storage body 10 has smaller variation in the peel strength of the cover tape 16 than in the storage body 90 of the second comparative example containing the discontinuities 98 (compare FIG. 2 and FIG. 12). In the storage body 10 it is also more difficult for dust to penetrate into the recess portions 20 than in the storage body 90 of the second comparative example containing the discontinuities 98.

Note that in the storage body 90 of the second comparative example, even supposing there were no discontinuities 98 present, in practice there is some variation in the peel strength of the cover tape 16 at the boundaries 30 where the intermediate fixing portions 26 cease to be present.

In the storage body 10 of the first exemplary embodiment, the width W1 of the intermediate fixing portions 26 increases on progression from a recess portion 20 on the direction L1 side towards the intermediate portion between mutually adjacent recess portions 20, and decreases on progression from the central portion towards the recess portion 20 on the direction L2 side. Matching the increases and decreases of the width of the intermediate fixing portions 26, the width W2 of the overlapping portions 28A decreases on progression from the recess portion 20 on the direction L1 side of mutually adjacent recess portions 20 towards the central portion between the recess portions 20. The width W2 of the overlapping portions 28A also increases on progression from the central portion towards the recess portion 20 on the direction L2 side.

Accordingly, the peel strength of the cover tape 16 arising due to the intermediate fixing portions 26 increases then decreases on progression from the first direction L1 recess portions 20 to the second direction L2 recess portions 20. Corresponding thereto, the peel strength of the cover tape 16 arising due to the overlapping portions 28A decreases and then increases on progression from the first direction L1 recess portions 20 to the second direction L2 recess portions 20. Namely the changes in peel strength of the cover tape 16 due to the individual causes of the intermediate fixing portions 26 and the overlapping portions 28A change gradually along the tape length L direction. As a result, in the storage body 10, vibration of the storage body 10 caused by changes in the peel strength due to the individual causes of each of the fixing portions 26, 28A can be suppressed from occurring when the cover tape 16 is peeled off.

Moreover, in the storage body 10 of the first exemplary embodiment, the locations 26A further to the recess portion sides than the central portion of the intermediate fixing portions 26 taper towards each of the recess portions 20 and the leading end portions of each of the locations 26A are pointed. The angled portions of the pair of side fixing portions 28 (the angled portions of the connect positions 28C) that overlap with the respective locations 26A along the tape length L direction are accordingly obtuse angles. Due to the angled portions being obtuse angles, the peel strength can be reinforced compared to cases in which the angled portions are acute angles (cases with no leading taper: cases in which the end portion has a certain width). As a result the variation in the peel strength of the cover tape 16 can be made smaller.

Moreover, in the storage body 10 of the first exemplary embodiment, the plan view profile of the intermediate fixing portions 26 is a diamond shape. The peel strength due to the individual causes of the fixing portions 26, 28A along the tape length L direction accordingly changes linearly at positions where the intermediate fixing portions 26 and the pair of side fixing portions 28 overlap with each other. In other words, the individual peel strengths vary gradually. As a result, in the storage body 10, vibration of the storage body 10 due to variation in the peel strength caused by the fixing portions 26, 28A can be suppressed from occurring when the cover tape 16 is peeled off in comparison to when the intermediate fixing portions 26 are not formed in diamond shapes. For example, when misalignment with respect to the width direction of the tape body 14A of the overlapping portions 28A over a given tape length L direction range occurs during manufacturing processes, sometimes the minimum value of the width W2 of one of the overlapping portions 28A in this range becomes W2=0, with a discontinuity arising with that overlapping portion 28A.

In such cases, change in the peel strength over the range where there is misalignment hardly increases, or more precisely, the desired total width Wa becomes Wa', and at the same time the width of the adjacent connect portions 28B change by the same amount from the original Wb to Wb', and since Wa'=Wb' there is hardly any increase in the peel strength. As illustrated in the additional Fig. A, at the location where width W2 of the overlapping portions 28A is at a minimum value, when the length over which W2=0 is N, an intermediate portion 26M of the intermediate fixing portions 26 is also formed with a constant width over the length N of the tape length L direction. When this occurs, the overall width of the fixing portions 92 at any tape length L direction position is constant, and since the equation Wa=Wb is satisfied, a similar advantageous effect is exhibited of reducing any variation in peel strength of the cover tape 16 at the boundaries 30 where the intermediate fixing portions 26 cease to be present.

Second Exemplary Embodiment

Explanation Follows Regarding a Storage Body of a Second Exemplary Embodiment

Figure 6:
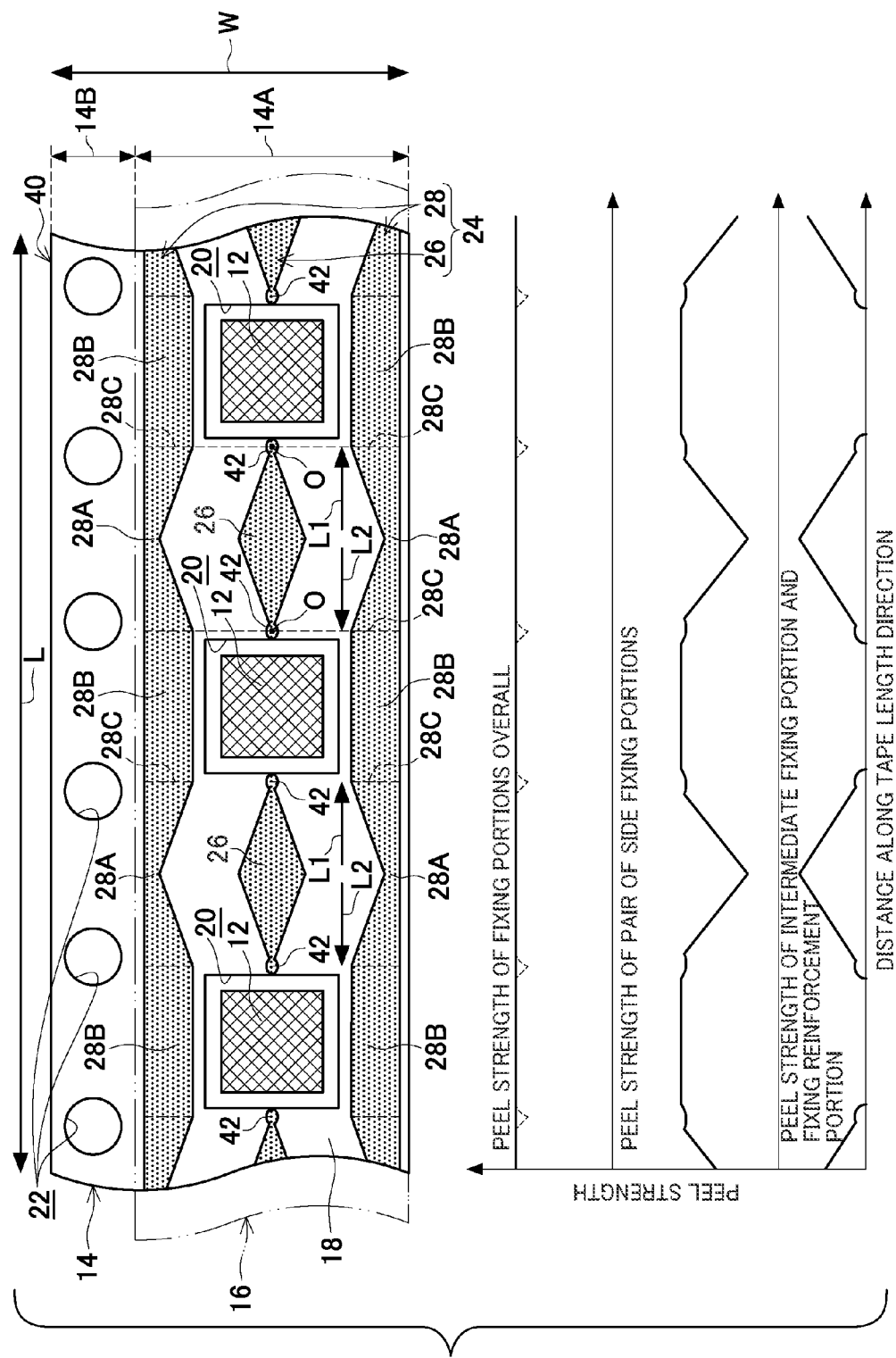
FIG. 6 depicts a plan view of a storage body according to a second exemplary embodiment and a graph illustrating overall peel strength arising from fixing portions in the storage body, together with peel strength arising from intermediate fixing portions and fixing reinforcement portions, and peel strength arising from a pair of side fixing portions.

As illustrated in FIG. 6, a storage body 40 of a second exemplary embodiment includes a carrier tape 14 and a cover tape 16 similarly to in the storage body 10 of the first exemplary embodiment. The carrier tape 14 and the cover tape 16 are fixed together by intermediate fixing portions 26, a pair of side fixing portions 28 and also by fixing reinforcement portions 42.

Figure 7:
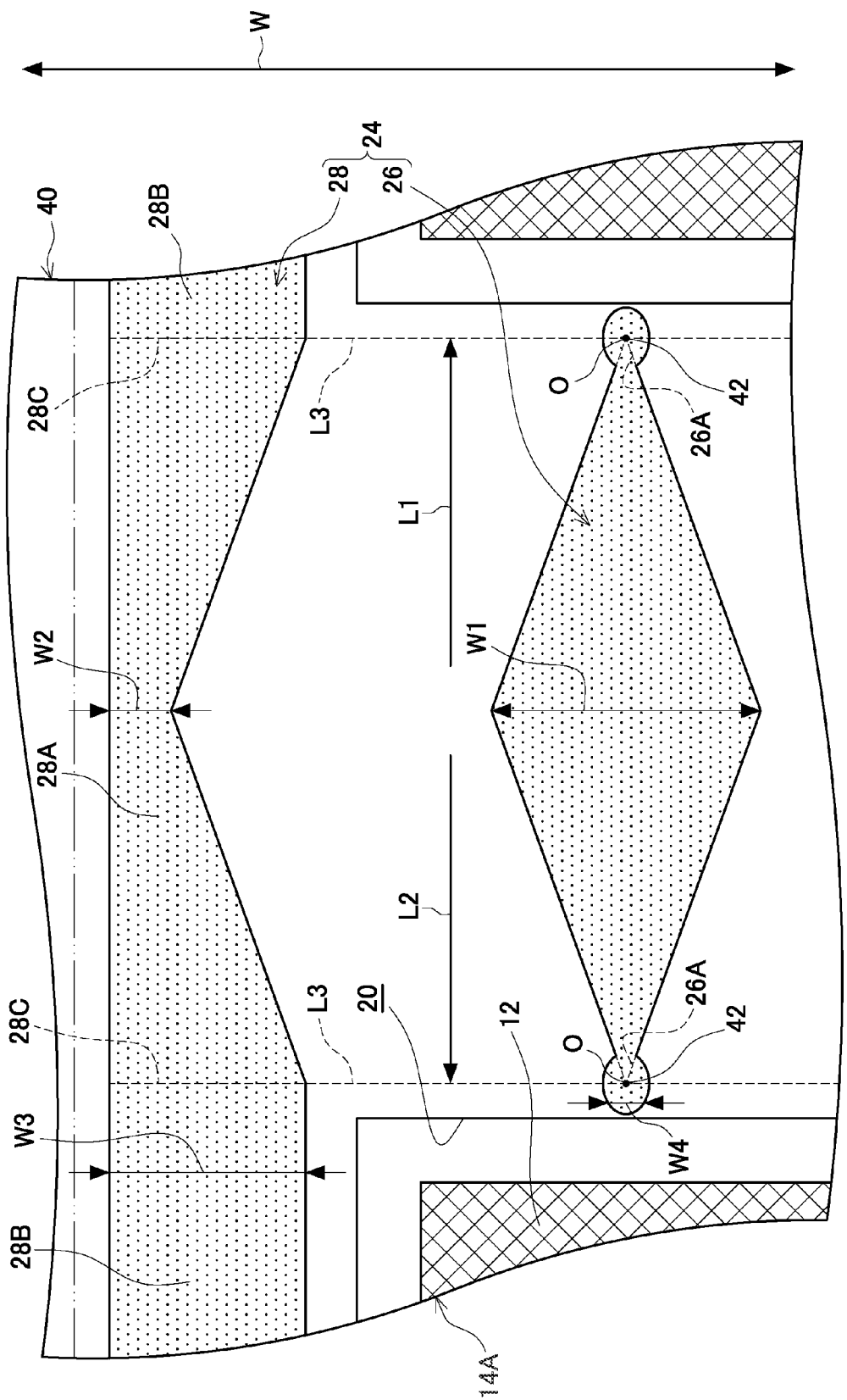
FIG. 7 is an enlarged diagram of the storage body according to the second exemplary embodiment illustrated in FIG. 6.

The fixing reinforcement portions 42 are integrally provided to the leading end portions of the locations 26A further to the recess portion sides than the intermediate fixing portions 26, and reinforce the fixing between the carrier tape 14 and the cover tape 16. As illustrated in FIG. 7, the fixing reinforcement portions 42 have elliptical shaped plan view profiles with widened diameter at the leading end portions of each of the locations 26A. The fixing reinforcement portions 42 are also in contact with the tape length L direction peripheral portions of the recess portions 20 and have centers O of the elliptical shapes positioned on extension lines L3 of the connect positions 28C between the overlapping portions 28A and the connect portions 28B.

Note that in FIG. 7 the external profile of the leading end portions of each of the locations 26A positioned within the elliptical shapes are illustrated by dashed lines.

In the storage body 10 of the first exemplary embodiment, even though the overall width of the fixing portions 24 is constant, as illustrated in FIG. 2, there is a slight reduction in peel strength of the cover tape 16 at the boundaries 30 in the tape length L direction where the intermediate fixing portions 26 cease to be present. This is caused by changes to other factors than the fixing surface area, such as for example the pressing force of the hot-press iron 34 at a step where the fixing portion is formed (the pressing force at the boundaries 30, particularly at the leading end portions of the locations 26A, and the pressing force of the angled portions of the pair of side fixing portions 28 overlapping with the leading end portions, both decrease).

According to the storage body 40 of the second exemplary embodiment, by providing the fixing reinforcement portions 42 at the leading end portions of the locations 26A of the intermediate fixing portions 26, the fixing surface area of the fixing portions 24 is increased locally around the periphery of the leading end portions. As a result the peel strength of the cover tape 16 is reinforced at the boundaries 30 where the intermediate fixing portions 26 cease to be present, and any change in peel strength of the cover tape 16 becomes smaller than in the storage body 10 of the first exemplary embodiment (compare FIG. 6 and FIG. 2).

Third Exemplary Embodiment

Figure 8:
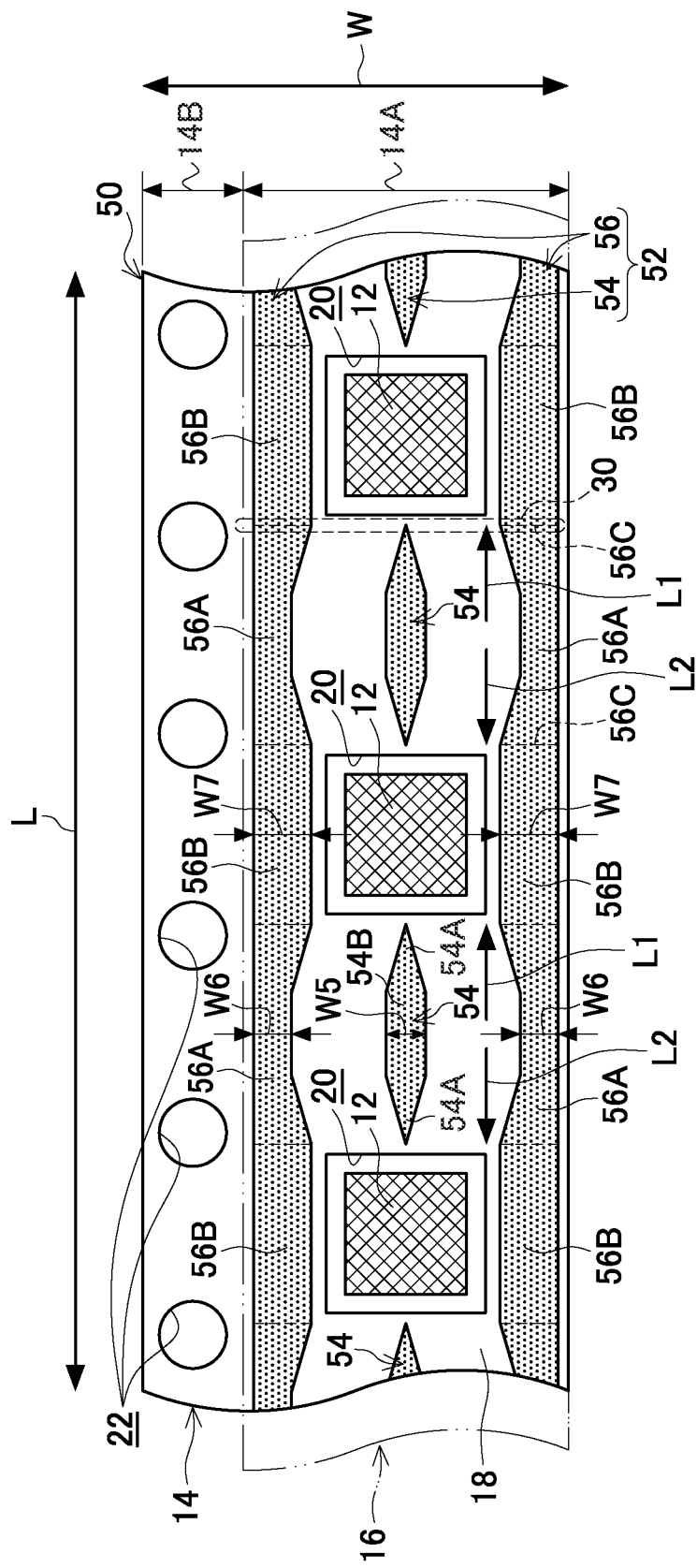
FIG. 8 is a plan view of a storage body according to a third exemplary embodiment.

Explanation Follows Regarding a Storage Body According to a Third Exemplary Embodiment As illustrated in FIG. 8, a storage body 50 of the third exemplary embodiment includes a carrier tape 14 and a cover tape 16 similar to those of the storage body 10 of the first exemplary embodiment. The carrier tape 14 and the cover tape 16 are fixed together by fixing portions 52. The fixing portions 52 include intermediate fixing portions 54 and a pair of side fixing portions 56 that are respectively formed with different shapes to those of the intermediate fixing portions 26 and the side fixing portions 28 described above.

The intermediate fixing portions 54 are formed between adjacent recess portions 20 along a tape length L direction. The intermediate fixing portions 54 are positioned at a central portion in the tape width direction W of the tape body 14A. A width W5 of the intermediate fixing portions 54 increases on progression from a recess portion 20 on a direction L1 side of mutually adjacent recess portions 20 towards an intermediate portion between the mutually adjacent recess portions. The width W5 of the intermediate fixing portions 54 is constant along the tape length L direction over the intermediate portion between the recess portions. The width W5 of the intermediate fixing portions 54 then decreases on progression from the intermediate portion towards a recess portion 20 on a direction L2 side. In the third exemplary embodiment, locations 54A further to the recess portion sides of the intermediate fixing portions 54 than an intermediate portion 54B are tapered on progression towards each of the recess portions 20, and the leading end portions of the locations 54A are pointed (acute angled). The leading end portions of each of the locations 54A reach far as the vicinity of the tape width direction W center of the edge portions of the recess portions 20.

The pair of side fixing portions 56 are formed along the tape length L direction at the two tape width direction W sides of each of the recess portions 20 and the intermediate fixing portions 54. Each of the side fixing portions 56 includes respective overlapping portions 56A and connect portions 56B.

The overlapping portions 56A are formed at the two tape width direction W sides of each of the intermediate fixing portions 54 with a width W6 that varies along the tape length L direction. The overlapping portions 56A overlap with the intermediate fixing portions 54 along the tape length L direction. The connect portions 56B are formed along the tape length L direction at the two tape width direction W sides of each of the recess portions 20 with a width W7. The connect portions 56B connect together the respective overlapping portions 56A disposed in lines along the tape length L direction at connect positions 56C. The connect positions 56C include boundaries 30 on the tape length L direction where the intermediate fixing portions 54 cease to be present.

The width W6 of each of the overlapping portions 56A is at a maximum value at the connect positions 56C in the tape length L direction, equivalent to the width W7 of the connect portions 56B. The width W6 of the overlapping portions 56A between the connect positions 56C decreases and then increases along the tape length L direction to match the increase and decrease of the width W5 of the intermediate fixing portions 54.

Specifically, the width W6 of the overlapping portions 56A decreases at half the rate of the increase in the width W5 of the intermediate fixing portions 54 on progression from the recess portion 20 on a direction L1 side of mutually adjacent recess portions 20 towards the intermediate portion between the mutually adjacent recess portions 20. The width W6 is at a minimum value at the intermediate portion. The width W6 of each of the overlapping portions 56A then increases at half the rate of the decrease in the width W5 of the intermediate fixing portions 54 on progression from the intermediate portion towards the recess portion 20 on the direction L2 side of the recess portions 20 where it reaches a maximum value (W6=W7). As a result, the total width Wa of the width W5 of the intermediate fixing portions 54 and the width W6 of the pair of overlapping portions 56A at a given tape length L direction position (=W5+W6×2) is equivalent to the total width Wb (=W7×2) of the pair of connect portions 56B.

According to the storage body 50 of the third exemplary embodiment, similar advantageous effects are exhibited to those of the first exemplary embodiment. In the storage body 50, due to the intermediate portion 54B having a constant width at overlapping portions 56A, the number of locations along the tape length L direction where the peel strength of the cover tape 16 arising from the pair of side fixing portions 56 is changing can be reduced.

Fourth Exemplary Embodiment

Figure 9:
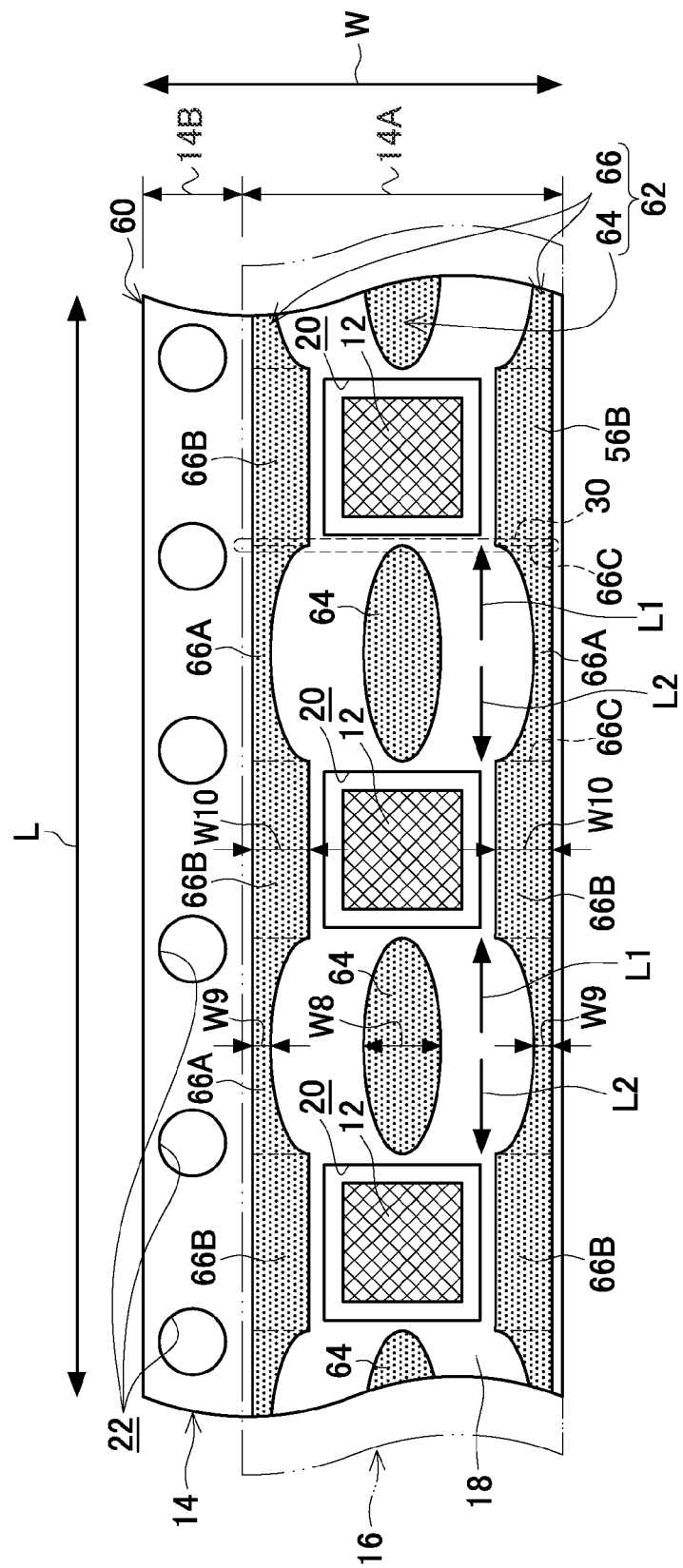
FIG. 9 is a plan view of a storage body according to a fourth exemplary embodiment.

Explanation Follows Regarding a Storage Body According to a Fourth Exemplary Embodiment As illustrated in FIG. 9, a body 60 of the fourth exemplary embodiment includes a carrier tape 14 and a cover tape 16 similar to those of the storage body 10 of the first exemplary embodiment. The carrier tape 14 and the cover tape 16 are fixed together by fixing portions 62. The fixing portions 62 include intermediate fixing portions 64 and a pair of side fixing portions 66 that are respectively formed with different shapes to those of the intermediate fixing portions 26 and the side fixing portions 28 described above.

The intermediate fixing portions 64 are formed along a tape length L direction between mutually adjacent recess portions 20. The intermediate fixing portions 64 are positioned at a central portion in the tape width direction W of the tape body 14A. A width W8 of the intermediate fixing portions 64 increases on progression from a recess portion 20 on a direction L1 side of mutually adjacent recess portions 20 towards a central portion between the mutually adjacent recess portions 20. The width W8 of the intermediate fixing portions 64 then decreases on progression from the central portion towards the recess portion 20 on a direction L2 side of the recess portions 20. In the fourth exemplary embodiment the intermediate fixing portions 64 are formed with elliptical shaped plan view profiles.

The pair of side fixing portions 66 are formed along the tape length L direction at the two tape width direction W sides of each of the recess portions 20 and the intermediate fixing portions 64. Each of the side fixing portions 66 includes respective overlapping portions 66A and connect portions 66B.

The overlapping portions 66A are formed at the two tape width direction W sides of each of the intermediate fixing portions 64 with a width W9 that varies along the tape length L direction. The overlapping portions 66A overlap with the intermediate fixing portions 64 along the tape length L direction. The connect portions 66B are formed along the tape length L direction at the two tape width direction W sides of each of the recess portions 20 with a constant width W10. The connect portions 66B connect together the respective overlapping portions 66A disposed in lines along the tape length L direction at connect positions 66C. The connect positions 66C include boundaries 30 on the tape length L direction where the intermediate fixing portions 64 cease to be present.

The width W9 of each of the overlapping portions 66A is at a maximum value in the tape length L direction at the connect positions 66C, equivalent to the width W10 of the connect portions 66B. The width W9 of the overlapping portions 66A between the connect positions 66C decreases and then increases along the tape length L direction to match the increase and decrease of the width W8 of the intermediate fixing portions 64.

Specifically, the width W9 of each of the overlapping portions 66A decreases at half the rate of the increase in the width W8 of the intermediate fixing portions 64 on progression from the recess portion 20 on the direction L1 side of mutually adjacent recess portions 20 towards the central portion between the mutually adjacent recess portions 20. The width W9 of each of the overlapping portions 66A increases at half the rate of the decrease in the width W8 of the intermediate fixing portions 64 on progression from the central portion towards the recess portion 20 on a direction L2 side of the mutually adjacent recess portions 20 where it reaches a maximum value (W9=W10). As a result, the total width Wa of the width W8 of the intermediate fixing portions 64 and the width W9 of the pair of overlapping portions 66A at a given tape length L direction position (=W8+W9×2) is equivalent to the total width Wb of the pair of connect portions 66B (=W10×2).

According to the storage body 60 of the fourth exemplary embodiment, as well as similar advantageous effects being exhibited to those of the first exemplary embodiment, the intermediate fixing portions 64 are not angular. As a result, according to the storage body 60, the peel strength arising from the intermediate fixing portions 64 at the peripheral portions can be better suppressed from becoming smaller than the peel strength of the central portion of the intermediate fixing portions 64 than in cases where the storage body 60 is angular.

Fifth Exemplary Embodiment

Figure 10:
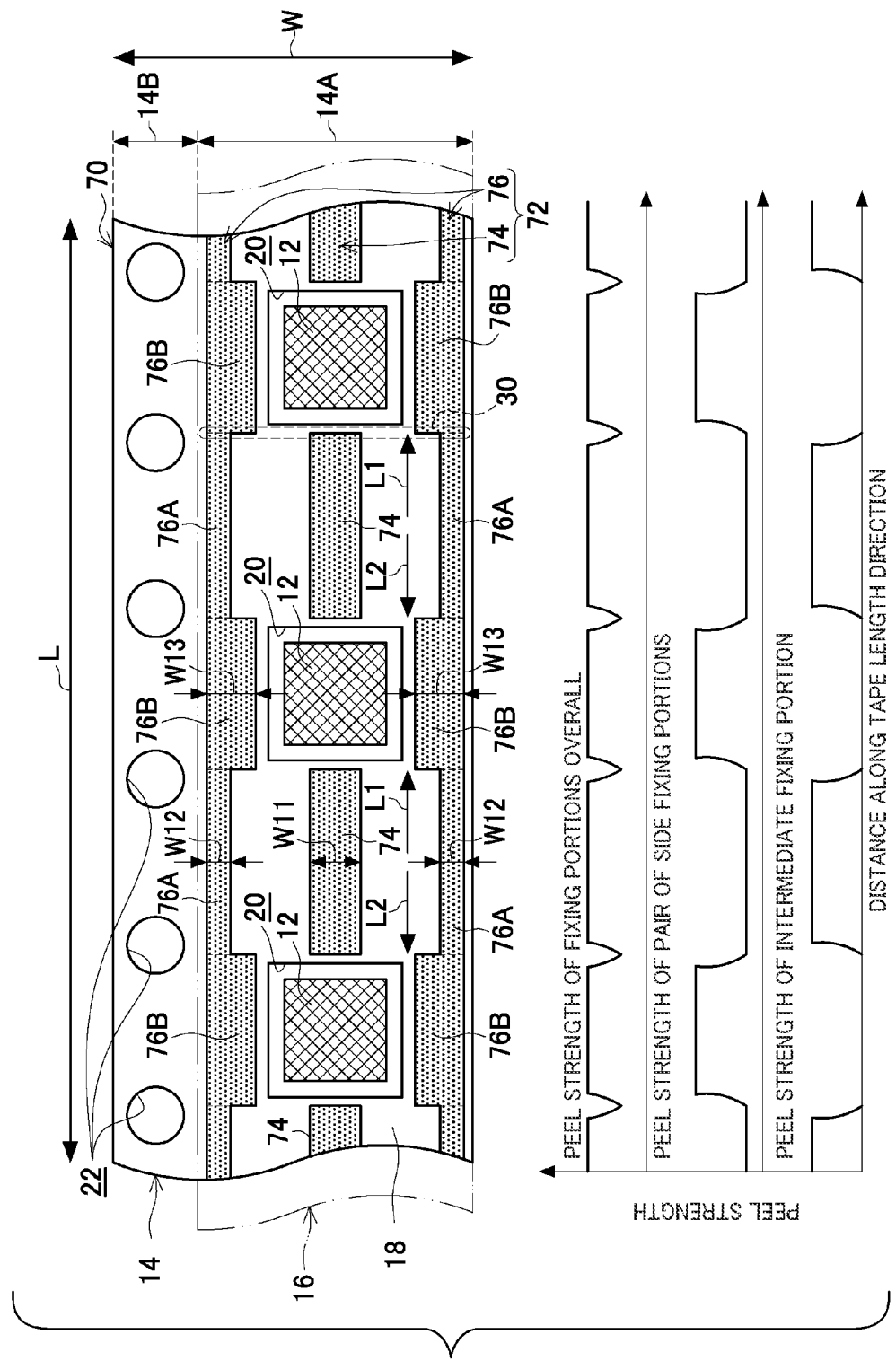
FIG. 10 depicts a plan view of a storage body according to a fifth exemplary embodiment and a graph illustrating overall peel strength arising from fixing portions in the storage body, together with peel strength arising from intermediate fixing portions, and peel strength arising from a pair of side fixing portions.

Explanation Follows Regarding a Storage Body of According to a Fifth Exemplary Embodiment As illustrated in FIG. 10 body 70 according to the fifth exemplary embodiment includes a carrier tape 14 and a cover tape 16 similar to those of the storage body 10 of the first exemplary embodiment. The carrier tape 14 and the cover tape 16 are fixed together by fixing portions 72. The fixing portions 72 include intermediate fixing portions 74 and a pair of side fixing portions 76 that are respectively formed with different shapes to those of the intermediate fixing portions 26 and the side fixing portions 28 described above.

The intermediate fixing portions 74 are formed along a tape length L direction between mutually adjacent recess portions 20. The intermediate fixing portions 74 are positioned at a central portion in the tape width direction W of the tape body 14A. A width W11 of the intermediate fixing portions 74 is constant across from a recess portion 20 on a direction L1 side of mutually adjacent recess portions 20 to a recess portion 20 on a direction L2 side, namely the width W11 is constant along the tape length L direction. In the fifth exemplary embodiment the intermediate fixing portions 74 are formed with rectangular shaped plan view profiles.

The pair of side fixing portions 76 are formed along the tape length L direction at the two tape width direction W sides of each of the recess portions 20 and the intermediate fixing portions 74. The side fixing portions 76 include respective overlapping portions 76A and connect portions 76B.

The overlapping portions 76A are formed at the two tape width direction W sides of the respective intermediate fixing portions 74 with a width W12 that is constant along the tape length L direction. The overlapping portions 76A overlap with the intermediate fixing portions 74 along the tape length L direction. The connect portions 76B are formed along the tape length L direction at the two tape width direction W sides of each of the recess portions 20 with a constant width W13. The connect portions 76B connect together the respective overlapping portions 76A disposed in lines along the tape length L direction at connect positions 76C. The connect positions 76C include boundaries 30 on the tape length L direction where the intermediate fixing portions 74 cease to be present.

The width W12 of each of the overlapping portions 76A is narrower than the width W13 connect portions 76B by an amount that is half the width W11 of the intermediate fixing portions 74. As a result, the total width Wa of the width W11 of the intermediate fixing portions 74 and the width W12 of the pair of overlapping portions 76A at a given tape length L direction position (=W11+W12×2) is equivalent to the total width Wb of the pair of connect portions 76B (=W13×2).

According to the storage body 70 of the fifth exemplary embodiment, similar advantageous effects are exhibited to those of the first exemplary embodiment. However, compared to the fifth exemplary embodiment, configurations are preferable, such as in the first exemplary embodiment to the fourth exemplary embodiment, in which the width of the intermediate fixing portion increases and then decreases and the width of the overlapping portions decrease and then increase on progression from a recess portion 20 on the direction L1 side of mutually adjacent recess portions 20 towards the other recess portions 20 on a direction L2 side. This is because adopting such a configuration enables variation in the peel strength of the cover tape 16 to be made smaller (compare FIG. 10 and FIG. 2).

Modified Example

The Technology Disclosed Herein has been Explained by Way of Plural Exemplary Embodiments, However the Technology Disclosed Herein is not Limited Thereby For example, explanation has been given of cases in which a single intermediate fixing portion 26 is provided between a recess portion 20 and a mutually adjacent recess portion 20, however plural intermediate fixing portions 26 may be provided across the tape width direction W. In such cases, the width W2 of each of the overlapping portions 28A narrows by an amount that is less than the connect portions 28B by half the total width of the width W1 of the intermediate fixing portions 26 at a given tape length L direction position. Furthermore explanation has been given of cases in which the total width Wa of the width W1 of the intermediate fixing portions 26 and the width W2 of the pair of overlapping portions 28A is equivalent of the total width Wb of the pair of connect portions 28B, however allowance may be made for manufacturing error. Namely, cases in which the total width Wa is substantially the same as the total width Wb fall inside the scope of the spirit of the technology disclosed herein.

In the second exemplary embodiment, explanation has been given of a case in which the fixing reinforcement portions 42 are formed in elliptical shapes in plan view profile, however they may be formed with simple circular shapes, or may be formed with square or rectangular shapes.

A method has been explained in which the shape of the fixing portions 24 is formed by hot-press fixing, however the fixing portions 24 may be formed by coating an adhesive on the tape body 14A and then superimposing the cover tape 16 thereon.

Obviously it is possible to implement various modifications to the technology disclosed herein within a range not departing from the spirit thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A storage body comprising:
   a tape formed with recess portions that dip in in a tape thickness direction and are formed at intervals along the tape length direction;
   a cover that is superimposed on the tape and closes off openings of the recess portions;
   intermediate fixing portions that fix together the tape and the cover and are formed between mutually adjacent recess portions of the recess portions, the intermediate fixing portion having a tape width direction width that increases on progression from one of the mutually adjacent recess portions towards an intermediate portion between the mutually adjacent recess portions and that decreases on progression from the intermediate portion towards the other mutually adjacent recess portion; and
   a pair of side fixing portions that fix together the tape and the cover and include
      overlapping portions that are formed at the two tape width direction sides of the intermediate portions overlapping with the intermediate portions along the tape length direction, the overlapping portions having tape width direction widths that decrease on progression from one of the mutually adjacent recess portions towards an intermediate portion between the mutually adjacent recess portions and that increase on progression from the intermediate portion towards the other mutually adjacent recess portion, and
      connect portions formed with a constant tape width direction width and connecting together the overlapping portions disposed in lines along the tape length direction, wherein
   the total width of the intermediate portions and the pair of overlapping portions is equivalent to the total width of the pair of connect portions.

2. The storage body of claim 1, wherein the overlapping portions include discontinuous locations at locations where the width of the overlapping portions is at a minimum.

3. The storage body of claim 1, wherein locations of the intermediate portion on the recess portion sides are tapered to points on progression towards the adjacent recess portions.

4. The storage body of claim 3, wherein the plan view profile of the intermediate portions is diamond shaped.

5. The storage body of claim 3 further comprising fixing reinforcement portions that are formed at leading end portions of locations of the intermediate portion on the recess portion sides and that reinforce fixing between the tape and the cover.

6. A reel comprising:
   a real body;
   a storage body wound on the reel body; and
   electronic components stored in a respective recess portions of the storage body, wherein
      the storage body includes;
         a tape formed with recess portions that dip in in a tape thickness direction and are formed at intervals along the tape length direction;
         a cover that is superimposed on the tape and closes off openings of the recess portions;
         intermediate fixing portions that fix together the tape and the cover and are formed between mutually adjacent recess portions of the recess portions, the intermediate fixing portion having a tape width direction width that increases on progression from one of the mutually adjacent recess portions towards an intermediate portion between the mutually adjacent recess portions and that decreases on progression from the intermediate portion towards the other mutually adjacent recess portion; and
         a pair of side fixing portions that fix together the tape and the cover and include
            overlapping portions that are formed at the two tape width direction sides of the intermediate portions overlapping with the intermediate portions along the tape length direction, the overlapping portions having tape width direction widths that decrease on progression from one of the mutually adjacent recess portions towards an intermediate portion between the mutually adjacent recess portions and that increase on progression from the intermediate portion towards the other mutually adjacent recess portion, and
connect portions formed with a constant tape width direction width and connecting together the overlapping portions disposed in lines along the tape length direction, wherein
the total width of the intermediate portions and the pair of overlapping portions is equivalent to the total width of the pair of connect portions.

\* \* \* \* \*